United States Patent
Kinoh et al.

[11] Patent Number: 5,867,390
[45] Date of Patent: Feb. 2, 1999

[54] ADHESIVE APPLYING METHOD

[75] Inventors: Toshiyuki Kinoh, Kofu; Akihiko Wachi, Yamanashi-ken, both of Japan

[73] Assignee: Matsushita Electric Industrial Co., Ltd., Japan

[21] Appl. No.: 919,772

[22] Filed: Aug. 29, 1997

[30] Foreign Application Priority Data

Sep. 5, 1996 [JP] Japan .................................. 8-234588

[51] Int. Cl.$^6$ .............................. G06F 19/00; B05C 5/00
[52] U.S. Cl. ............... 364/469.02; 118/697; 364/468.28
[58] Field of Search .................. 364/469.02, 469.01, 364/468.28, 468.24, 468.13, 468.01, 468.03; 73/304 R, 307, 308, 314; 118/302, 669, 682, 684, 663, 696, 697, 699, 712, 713; 427/10; 156/350, 351, 352, 357, 360, 578; 222/1, 14, 55, 64, 66, 52, 61, 638, 639

[56] References Cited

U.S. PATENT DOCUMENTS

| | | | |
|---|---|---|---|
| 4,919,074 | 4/1990 | Kurihara et al. .................. | 118/697 |
| 5,042,688 | 8/1991 | Srivastava et al. .................. | 222/55 |
| 5,078,010 | 1/1992 | Lock .................................. | 73/304 R |
| 5,505,777 | 4/1996 | Ciardella et al. .................. | 118/663 |

*Primary Examiner*—Resa I. Elmore
*Assistant Examiner*—Steven R. Garland
*Attorney, Agent, or Firm*—Parkhurst & Wendel

[57] ABSTRACT

The invention provides an adhesive applying method which makes it possible to perform a stabilized adhesive applying operation and to reduce the overall production time. In detecting the amount of adhesive applied and performing a corrective operation so as to ensure application of a predetermined amount of adhesive, a corrected value obtained by a corrective operation is stored at step #5. At step #7, an infinitesimal correction formula which shows the relationship of the corrected value with respect to the amount of adhesive used is found on the basis of the corrected values stored last time and this time and on the basis of the amount of adhesive used during the time from the preceding corrective operation and the current corrective operation. And a productive corrected value found by the infinitesimal correction formula is used for adhesive application from the next time on.

4 Claims, 5 Drawing Sheets

PRIOR ART

PRIOR ART

ADHESIVE APPLYING METHOD

FIELD OF THE INVENTION

The present invention relates to an adhesive applying method whereby in order to adhesively fix electronic parts to a printed circuit board, an adhesive is applied to the fixing positions.

BACKGROUND OF THE INVENTION

Recently, automatic machines for packaging electronic parts have been developed. For example, when electronic parts are to be adhesively fixed to a printed circuit board, an automatic adhesive applying machine, such as one disclosed in Japanese Laid-open Patent Application 3-217100, is used as an apparatus for applying an adhesive to the fixing positions, wherein the amount of adhesive applied is automatically detected and on the basis of the result of the detection the amount of adhesive to be subsequently applied is corrected, whereupon the adhesive is automatically applied to the printed circuit board.

The conventional adhesive applying method using the aforesaid automatic adhesive applying machine will now be described with reference to FIGS. 4 and 5. In addition, the production program which sets the conditions for applying adhesive is composed of some blocks of data on the conditions for production, and the production program is headed with data on the conditions for correction used to correct the applying time. The data on the conditions for correction determines the time required for adhesive application and the prescribed amount of adhesive to be applied then.

FIG. 4 is a partial perspective view of an automatic adhesive applying machine for carrying out the conventional adhesive applying method, illustrating a head section for applying an adhesive, an actuating section for moving the head section to adhesive applying positions, and a detecting section for detecting the amount applied.

In FIG. 4, the head section comprises a mechanism section 402 supporting some tanks 401 which hold an adhesive and adapted to vertically and independently move one of the tanks 401 which is selected by the production program when performing an adhesive applying operation, an air control section 403 for pneumatically forcing a predetermined amount of adhesive out of the tank 401 which is independently moving up and down, and a recognition camera 404 for detecting the amount of adhesive applied. Further, each tank 401 comprises a nozzle or nozzles 405 through which the adhesive is forced out, and a plug 406 for confining the adhesive.

The actuating section comprises an X-axis robot 407 which longitudinally moves said head section, and a Y-axis robot 409 which transversely moves a table 408.

The detecting section comprises a tape 410 used for trial adhesive application in order to correct the amount of adhesive applied, a detecting table 411 for assisting in the application of adhesive onto the tape 410, and a cartridge 412 for holding the tape 410.

In the thus-constructed automatic adhesive applying machine, the adhesive applying operation is an operation for applying a predetermined amount of adhesive to predetermined positions on a board 413 held on the table 408, said operation comprising the steps of effecting positioning by means of the X-and Y-axis robots 407 and 409 according to positional information contained in the production program, forcing the adhesive in one or more tanks 401, selected by the production program, by an amount prescribed by the production program, to the tips of the nozzles 405, by pushing the associated plugs 406 by the air control section 403, and moving them up and down to apply the predetermined amount of adhesive to predetermined positions on the board 413.

Further, the adhesive application correcting operation is an operation for applying the adhesive for a predetermined time which is set by the data on the conditions for correction prior to performing a productive adhesive applying operation, so as to confirm whether or not the prescribed amount of adhesive has been applied, and if the prescribed amount of adhesive has not been applied, the applying time is adjusted to ensure that the prescribed amount of adhesive is applied.

In this adhesive application correcting operation, first the adhesive is applied to predetermined positions on the tape 410 supported on the table 411 and the amount of thus-applied adhesive is detected by the recognition camera 404. The amount of adhesive detected is compared with the prescribed amount of adhesive set by the data on the conditions for correction, and the applying time is adjusted to perform an adhesive application correcting operation again.

When the amount of adhesive applied for the applying time adjusted last time by the adhesive application correcting operation has finally converged to the prescribe amount of adhesive set by the data on the conditions for correction, the adhesive application correcting operation is terminated and is taken over by the productive adhesive applying operation. In this case, when the adhesive applying operation has been performed by a predetermined number of times, the tape 410 is fed out a predetermined length so as to prevent coatings of adhesive applied from overlapping each other. A series of adhesive application correcting operations are thus completed.

Referring to the adhesive application correcting method in the conventional adhesive applying method, the operation will now be described with reference to FIG. 4 by using a flowchart as shown in FIG. 5. In addition, in this adhesive application correcting method, the production program has been drafted so that an adhesive application correcting operation will be performed prior to a productive adhesive applying operation on a board.

First, at step #51, one of the tanks 401 is moved to the position of the detecting table 411 which is set by the data on the conditions for correction in the production program and a corrective adhesive applying operation is performed, in which the adhesive is discharged for a predetermined time which is set by the data on the conditions for correction. At step #52, the recognition camera 404 is moved to the detecting table 411 to detect the amount of adhesive.

At step #53, a decision is made as to whether the amount of adhesive detected at the step #52 is within the range of the allowable limits of the prescribed amount set by the data on the conditions for correction. If the amount of adhesive is not within the range of allowable limits, at step #52 the applying time is adjusted to correct the amount of adhesive to be applied. That is, if the amount of adhesive is too much, the corrected amount is such as to shorten the applying time, while if it is too small, the corrected value is such as to prolong the applying time. After the adjustment of the applying time, the program returns to step #51 and the adhesive application correcting operation is repeated.

On the other hand, if the decision made at step #53 is within the range of the allowable limits of-the prescribed amount set by the data on the conditions for correction, the program moves to step #55, where the corrected value of the applying time obtained by said adhesive application correcting operation is used to adjust the applying time in the data on the conditions for production in the production program and a productive adhesive applying operation is performed.

At step #56, the productive adhesive applying operation is interrupted and a decision is made as to whether to perform an adhesive application correcting operation. If an adhesive application correcting operation is not to be per formed, the program moves to step #55 and the productive operation is continued. If an adhesive application correcting operation is to be performed, the program moves to step #51 to perform such corrective operation so as to find a corrected value again.

In the case of a continuous productive adhesive applying operation, such operation may be continued until the adhesive in the tanks is used up. When the absence of adhesive in the tanks has been detected, the production is interrupted and a warning lamp or the like is used to notify the operator of the operation being interrupted.

Recently, in the field of packaging of parts, the frequency of the use of an adhesive during production has increased owing to packaged parts being in chip form or owing to the use of a large-sized board, such as a mother board in a computer, for packaging parts thereon. As a result, there has been a need for an automatic adhesive applying machine corresponding to an adhesive applying method which is capable of accurately effecting more stabilized application of adhesive.

With the aforesaid conventional adhesive applying method, however, in order to achieve stabilized application of a given amount of adhesive at all times in a continuous productive adhesive applying operation, it is necessary to change the conditions for adhesive application, i.e., the applying time, air pressure for adhesive application, etc., according to the amount of adhesive in the tanks, it being difficult to realize a stabilized continuous adhesive applying operation for applying a fixed amount of adhesive all the times.

As an approach to this problem, there is an adhesive application correcting method which adjusts conditions for applying a predetermined amount of adhesive each time the production of a given number of boards is completed. With such adhesive application correcting method, however, there arises a new problem that changes in the amount of adhesive applied during the production of a given number of boards cannot be corrected.

Further, another problem is the interruption of production owing to a shortage of adhesive during the adhesive applying operation. Other problems are that since said shortage of adhesive occurs suddenly, it takes substantial time to prepare a new supply of adhesive to resume production, and that such interruption of productive adhesive applying operation detracts from the reliability of boards produced.

DISCLOSURE OF THE INVENTION

The present invention solves the aforesaid problems inherent in the prior art and provides an adhesive applying method which makes it possible to effect a stabilized productive adhesive applying operation feeding a fixed amount of adhesive, and to shorten the overall production time by reducing the number of adhesive application correcting operations.

The invention also provides an adhesive applying method which makes it possible to reduce the idle time due to preparation for production, to find the number of boards which can be produced with the remainder of the adhesive to allow a more accurate plan for production to be built, and to eliminate defective boards with adhesive ill applied during production, thereby enhancing the reliability of boards produced.

To solve the above problems, the adhesive applying method of the present invention is characterized in that the amount of adhesive to be used in an adhesive application correcting operation is finely adjusted, which adjustment is performed each time a given number of boards are produced.

Thus, a stabilized productive operation can be performed by feeding a given amount of adhesive, and the overall production time can be reduced by reducing the number of adhesive application correcting operations.

Further, the adhesive applying method of the present invention is characterized by finding the number of producible boards from the remainder of the adhesive in each tank and forecasting on the basis of this number of boards when the adhesive will run out.

Thus, it is possible to reduce the idle time due to preparation for production and to find the number of boards producible with the remainder of the adhesive to allow a more accurate plan for production to be built, and to eliminate defective boards with adhesive ill applied during production, thereby enhancing the reliability of boards produced.

An adhesive applying method of the invention as claimed in claim 1 is an adhesive applying method wherein a productive adhesive applying operation for applying an adhesive to electronic parts fixing positions on a printed circuit board to fix them thereon is preceded by detection of the amount of adhesive applied during a corrective adhesive application for correcting the amount of adhesive applied, on the basis of which detected amount the applying time, pressure and temperature for adhesive application are corrected, so as to effect a productive adhesive applying operation using a predetermined amount of adhesive, said adhesive applying method comprising three steps: the first step of storing, each time said corrective operation is effected, the corrected value of the amount of adhesive applied obtained by said corrective operation; the second step of finding the history of changes of the corrected value of the amount of adhesive on the basis of the individual corrected values of the preceding and current corrective operations stored by said first step and on the basis of the amount of adhesive used during the time from the preceding corrective operation to the current corrective operation; and the third step of finely adjusting the amount of adhesive to be applied before the next corrective operation on the basis of said history of changes found by said second step.

An adhesive applying method as claimed in claim 2 is a method wherein in the first step of claim 1, the history of changes of the corrected value of the amount of adhesive applied obtained by the corrective operations is stored for a single tank, and in the third step of claim 1, when a productive adhesive applying operation is to be performed using another tank after the current corrective operation, a productive adhesive application is effected while making a fine adjustment of the amount of adhesive on the basis of the history of changes associated with said single tank stored by said first step.

According to these methods, a fine adjustment is made of the amount of adhesive to be used during an adhesive application correcting operation which is effected each time a given number of boards have been produced.

An adhesive applying method as claimed in claim 3 is a method wherein, in applying an adhesive to fix electronic and parts fixing positions on a printed circuit board to fix them thereon, the method comprises: a step of detecting the presence or absence of adhesive by means of a plurality of sensors disposed at different positions; a step of adding lengths of time each elapsed from the time any sensor detects the absence of adhesive until another sensor detects the absence of adhesive; and a step of finding the number of boards to have applied thereto all of the remaining adhesive requiring the overall time for applying an adhesive which is preset on the basis of said added time, said overall adhesive application to said number of boards consuming all the remaining adhesive. According to this method, even in the final stage there is no possibility of the adhesive being left unused, nor is the possibility of the productive adhesive applying operation being interrupted midway along the printed circuit board.

An adhesive applying method as claimed in claim 4 is a method wherein, in applying an adhesive to electronic parts fixing positions on a printed circuit board to fix them thereon, the method comprises: a step of detecting the presence or absence of adhesive by means of a plurality of sensors disposed at different positions; a step of adding lengths of time each elapsed from the time any sensor detects the absence of adhesive until another sensor detects the absence of adhesive; and a step of finding the number of printed circuit boards sufficient to have all the remaining adhesive applied thereto on the basis of said added time and the preset overall adhesive applying time required for a single printed circuit board, so that an adhesive is stably applied to only that number of printed circuit boards which can use up said adhesive.

According to these methods, the number of boards which can be produced is found from the amount of the remaining adhesive in each tank, and when the adhesive will run out can be forecast on the basis of said number of boards.

EMBODIMENTS

Adhesive applying methods showing embodiments of the invention will now be described in the concrete with reference to FIGS. 1, 2, 3 and 4 by using an example of an adhesive applying machine corresponding to said methods. In addition, the basic arrangement of the adhesive applying machine used is the same as in the conventional example shown in FIG. 4.

FIRST EMBODIMENT

An adhesive applying method according to a first embodiment of the invention will now be described.

Figure 1:
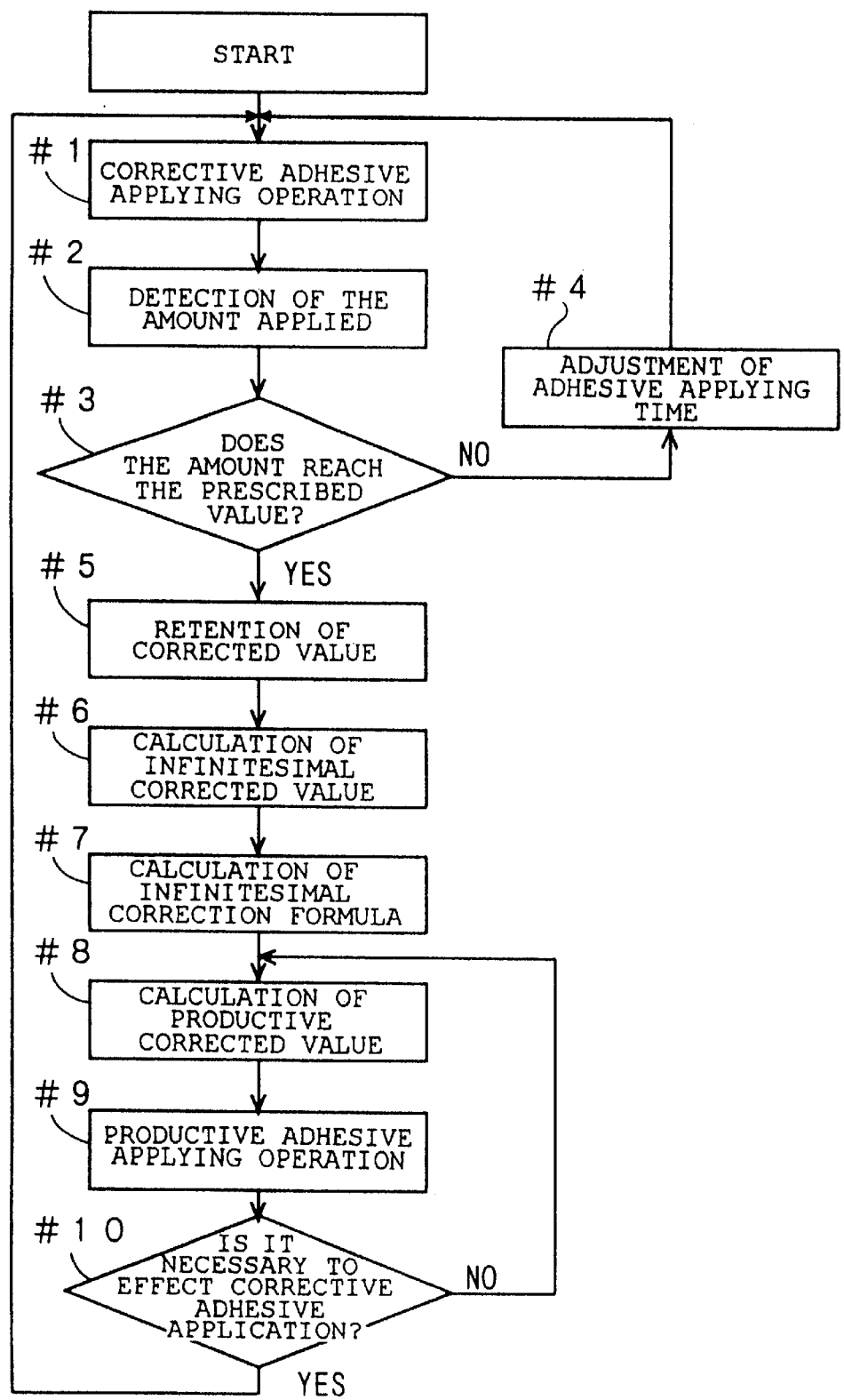
FIG. 1 is a flowchart of a corrective operation using an adhesive applying method according to a first embodiment of the invention.

FIG. 1 is a flowchart showing the flow of an adhesive applying operation in an adhesive applying method according to the first embodiment. In FIG. 1, at step #1, one of the tanks 406 is moved to the position of the detecting table 411 set by the data on the conditions for correction in a production program, and a corrective adhesive applying operation is performed for discharging an adhesive for a prescribed time set by the data on the conditions for correction. At step #2, the recognition camera 404 is moved to the position of the detecting table 411 to detect the amount of adhesive applied.

At step #3, a decision is made as to whether the amount of adhesive applied detected at step #2 is within the range of allowable limits set by the data on the conditions for correction. If it is found that the amount is not within said range, the adhesive applying time is adjusted at step #4 to correct the amount of adhesive to be applied, whereupon the program returns to step #1, where the corrective adhesive applying operation is repeated.

On the other hand, if the decision at step #3 indicates that the amount of adhesive applied is within the range of the allowable limits of the prescribed amount set by the data on the conditions for correction, the program moves to step #5, where the corrected value (corrected value $H_2$) corrected with respect to the amount of adhesive applied detected at step #2 is stored.

At step #6, the difference between the corrected value $H_1$ stored previously and the corrected value $H_2$ stored this time is calculated, and an infinitesimal corrected value $\Delta H$ is calculated according to the following formula 1 by using the overall adhesive applying time T (adhesive applying time not corrected by a corrected value which is set by the data on the conditions for production) used in the productive adhesive applying operation during the time from the preceding corrective operation to the current corrective operation.

$$\Delta H = (H_1 - H_2) \div T \qquad 1$$

At step #7, in order to find a productive corrected value Sh for correcting the adhesive applying time during a productive adhesive applying operation by using the infinitesimal corrected value $\Delta H$ shown in Formula 1, an infinitesimal correction formula as shown in Formula 2 is derived. In Formula 2, $\Delta T$ is the sum of the lengths of time to be used in productive adhesive applying operations after the current corrective operation.

$$Sh = \Delta H \times \Delta T + H_2 \qquad 2$$

At step #8, the productive corrected value Sh for adjusting the adhesive applying time in the next productive adhesive applying operation is found by using the infinitesimal correction formula found at step #7. At step #9, a productive adhesive applying operation is performed with an adhesive applying time corrected by the productive corrected value Sh.

At step #10, the productive adhesive applying operation is interrupted and a decision is made as to whether a corrective adhesive applying operation is to be performed. If a corrective adhesive applying operation is not to be performed, the program moves to step #8, where the process for finding the productive corrected value Sh is repeated. If a corrective adhesive applying operation is to be performed, the program moves to step #1, where a corrective adhesive applying operation is performed to find an infinitesimal corrected value and a productive corrected value Sh again.

Further, by storing the infinitesimal correction formula and the range of corrected value used in said infinitesimal correction formula after each corrective adhesive applying operation, it is possible to find an adhesive change history formula for a single tank. Thus, by performing an corrective adhesive applying operation and using such adhesive change history formula for a single tank, it is possible to perform a productive adhesive applying operation while adjusting the adhesive applying time without having to perform any adhesive corrective operation from now on.

Further, as an alternative to a method of finding an infinitesimal correction formula effective till the next adhesive applying operation, it is possible to use the infinitesimal correction formula found by the adhesive applying operations performed up to now, so as to find, through adjustment, an adhesive change history formula for a single tank.

SECOND EMBODIMENT

An adhesive applying method according to a second embodiment of the invention will now be described.

Figure 3:
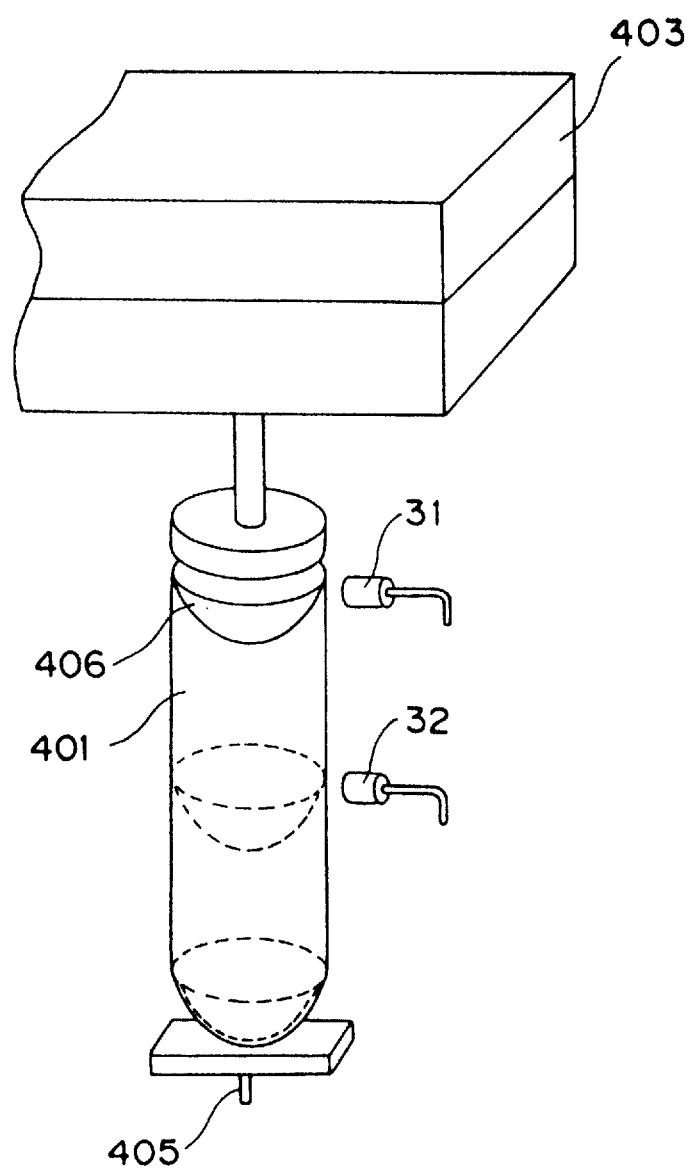
FIG. 3 is a perspective view of an adhesive detecting section for realizing the adhesive applying method in said embodiment.
Figure 4:
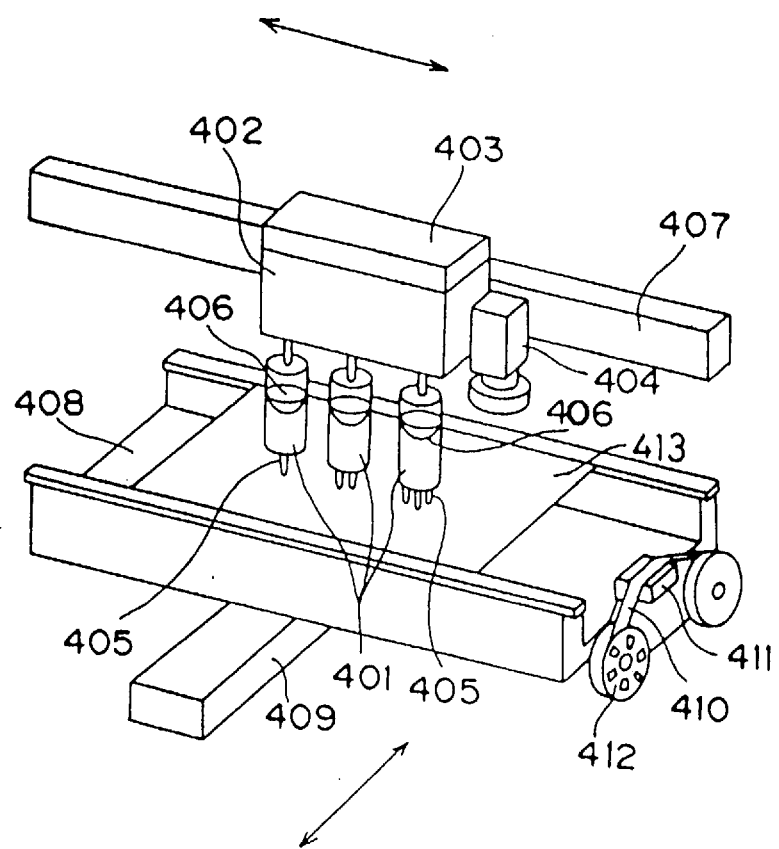
FIG. 4 is a fragmentary perspective view of an adhesive applying machine for performing a conventional adhesive applying method.
Figure 5:
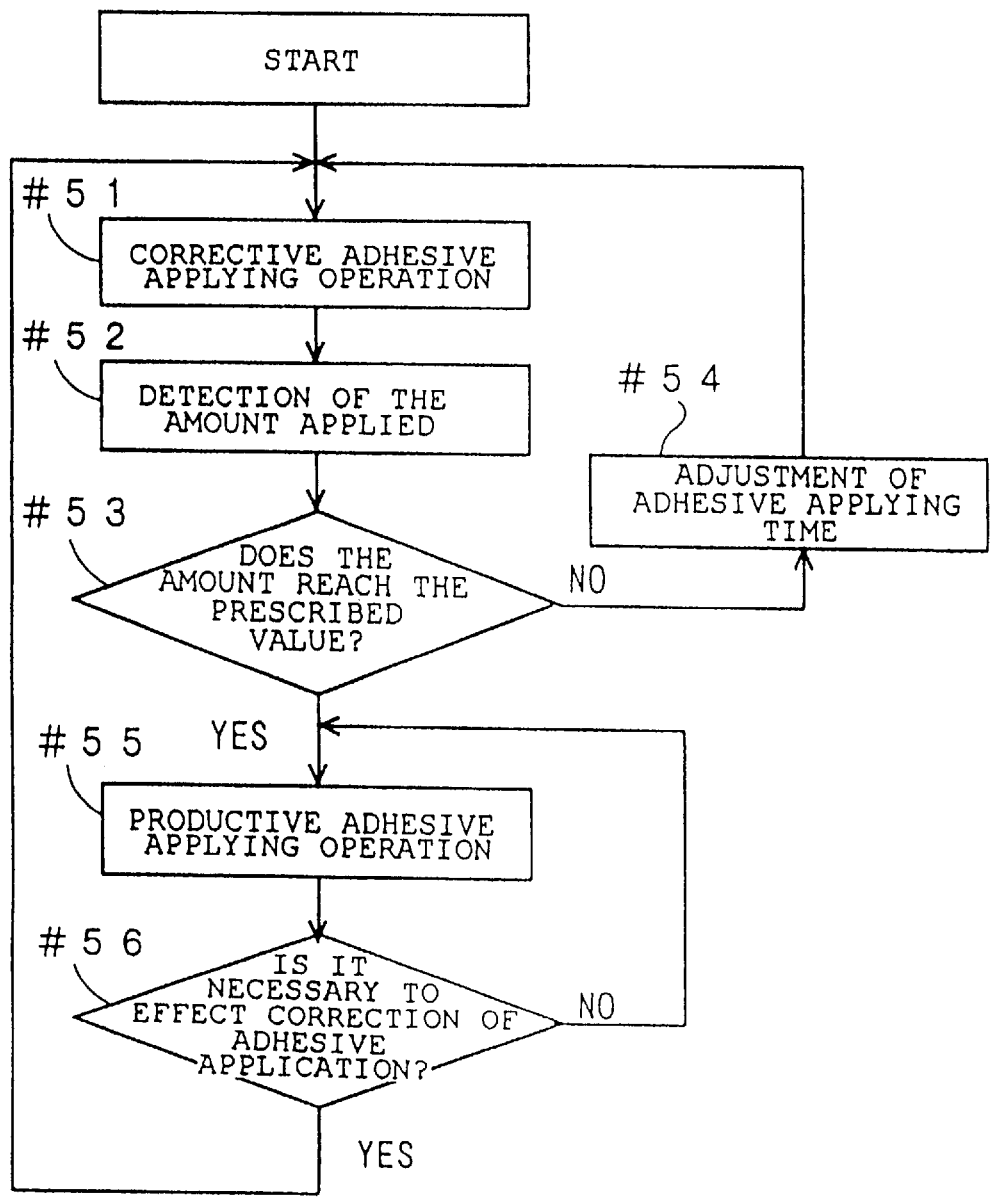
FIG. 5 is a flowchart of an operation for correcting adhesive application using said conventional adhesive applying method.

FIG. 3 is a structural view of a device for detecting the amount to be used corresponding to the amount of adhesive applied in the adhesive applying method of the second embodiment of the invention. In FIG. 3, the device for detecting the amount to be used corresponding to the amount of adhesive applied comprises a tank 401 for holding an adhesive, a plug 406 for confining the adhesive in the tank 401, an air control section 403 for forcing the predetermined adhesive through a nozzle 405 disposed on the tip of the tank by feeding air into the tank 401 to push the plug 406, and sensors 31, 32 for sensing the passage of the plug 406. The sensor 32 is disposed intermediate between the position where the passage of the plug 406 is detected by the sensor 31 and the position where the adhesive is exhausted.

Figure 2:
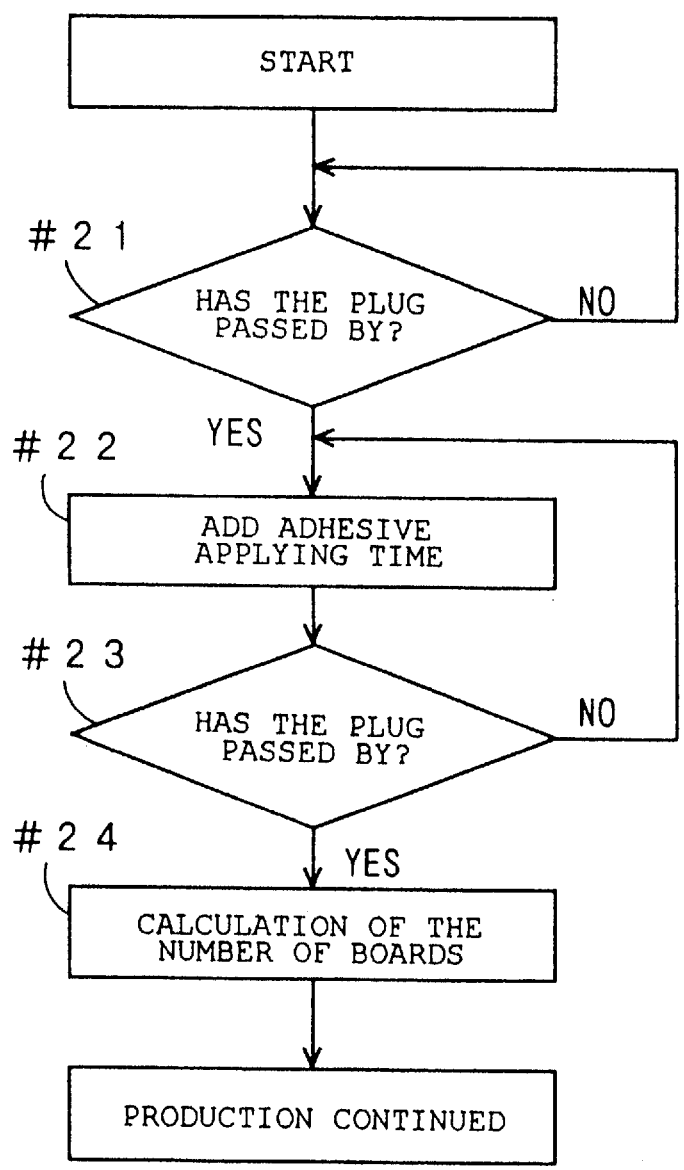
FIG. 2 is a flowchart of a corrective operation using an adhesive applying method according to a second embodiment of the invention.

FIG. 2 is a flowchart showing the flow of an adhesive applying operation in the adhesive applying method of this embodiment, which adhesive applying operation is performed by a device constructed in the manner shown in FIG. 3.

In FIG. 2, at step #21, the sensor 31 makes a decision as to whether the plug 406 has passed. In cases where the plug 406 has passed by the sensor 31, at step #22 addition is made of the applying time contained in the data on the conditions for production used during the time from the sensor 31 to the sensor 32. At step #23, the sensor 32 makes a decision as to whether the plug 406 has passed. In cases there the plug 406 has passed by the sensor 32, at step #22 how many boards can be produced with the remaining adhesive is calculated from the overall adhesive applying time obtained by addition at step #22 and the overall adhesive applying time for a single board set by the data on the conditions for production.

It goes without saying that in each of the above embodiments, even if there are more than two sensors, the same can be performed. Further, the conditions for finding the history of changes of the amount of adhesive applied is not limited to time but may be expressed in terms of pressure, the number of times, or temperature.

What is claimed is:

1. An adhesive applying method wherein a productive adhesive applying operation for applying an adhesive to electronic parts fixing positions on a printed circuit board to fix them thereon is preceded by detection of the amount of adhesive applied during a corrective adhesive operation for correcting the amount of adhesive applied, on the basis of which detected amount the applying time, pressure and temperature for adhesive application are corrected, so as to effect a productive adhesive applying operation using a predetermined amount of adhesive, said adhesive applying method comprising three steps:

the first step of storing, each time said corrective operation is effected, the corrected value of the amount of adhesive applied obtained by said corrective operation;

the second step of finding a history of changes of the corrected value of the amount of adhesive on the basis of the individual corrected values of the preceding and current corrective operations stored by said first step and on the basis of an amount of adhesive used during the time from the preceding corrective operation to the current corrective operation; and the third step of finely adjusting the amount of adhesive to be applied before the next corrective operation on the basis of said history of changes found by said second step.

2. An adhesive applying method as defined in claim 1 wherein in the first step, the history of changes of the corrected value of the amount of adhesive applied obtained by the corrective operations is stored for a single tank, and in the third step, when a productive adhesive applying operation is to be performed using another tank after the current corrective operation, a productive adhesive application is effected while making a fine adjustment of the amount of adhesive on the basis of the history of changes associated with said single tank stored by said first step.

3. An adhesive applying method wherein, in applying an adhesive to fix electronic parts fixing positions on a printed circuit board to fix them thereon, the method comprises:

a step of detecting the presence or absence of adhesive by means of a plurality of sensors disposed at different positions;

a step of adding lengths of time each elapsed from the time any sensor detects the absence of adhesive until another sensor detects the absence of adhesive; and a step of finding the number of boards to have applied thereto all of the remaining adhesive using an overall time for applying an adhesive which is preset and on the basis of said added time, and an adhesive application to said number of boards consuming all the remaining adhesive.

4. An adhesive applying method wherein, in applying an adhesive to electronic parts fixing positions on a printed circuit board to fix them thereon, the method comprises:

a step of detecting the presence or absence of adhesive by means of a plurality of sensors disposed at different positions;

a step of adding lengths of time each elapsed from the time any sensor detects the absence of adhesive until another sensor detects the absence of adhesive; and a step of finding the number of printed circuit boards sufficient to have all the remaining adhesive applied thereto on the basis of said added time and a preset overall adhesive applying time required for a single printed circuit board, so that an adhesive is stably applied to only that number of printed circuit boards which can use up said adhesive.

* * * * *